United States Patent
Chan et al.

(10) Patent No.: US 11,488,826 B2
(45) Date of Patent: Nov. 1, 2022

(54) SELF-ALIGNED LAYER PATTERNING

(71) Applicant: IMEC vzw, Leuven (BE)

(72) Inventors: Boon Teik Chan, Wilsele (BE); Yong Kong Siew, Heverlee (BE); Juergen Boemmels, Heverlee (BE)

(73) Assignee: IMEC vzw, Leuven (BE)

( * ) Notice: Subject to any disclaimer, the term of this patent is extended or adjusted under 35 U.S.C. 154(b) by 144 days.

(21) Appl. No.: 16/931,230

(22) Filed: Jul. 16, 2020

(65) Prior Publication Data
US 2021/0020516 A1    Jan. 21, 2021

(30) Foreign Application Priority Data
Jul. 18, 2019 (EP) .................... 19186997

(51) Int. Cl.
| | | |
|---|---|---|
| *H01L 21/033* | (2006.01) | |
| *H01L 21/027* | (2006.01) | |
| *H01L 21/8234* | (2006.01) | |
| *H01L 29/417* | (2006.01) | |
| *H01L 29/66* | (2006.01) | |
| *H01L 29/78* | (2006.01) | |

(52) U.S. Cl.
CPC ...... *H01L 21/0337* (2013.01); *H01L 21/0274* (2013.01); *H01L 21/823431* (2013.01); *H01L 29/41791* (2013.01); *H01L 29/6681* (2013.01); *H01L 29/785* (2013.01)

(58) Field of Classification Search
CPC ............ H01L 21/0274; H01L 21/0337; H01L 21/302; H01L 21/308; H01L 21/3083; H01L 21/3086; H01L 21/823487; H01L 29/66477; H01L 29/66545; H01L 29/66795; H01L 29/6687; H01L 29/785; H01L 29/7855; H01L 29/78696; H01L 29/6681; B82Y 10/00; B82Y 40/00
See application file for complete search history.

(56) References Cited

U.S. PATENT DOCUMENTS

| | | | |
|---|---|---|---|
| 9,941,164 B1 * | 4/2018 | Kim | .................. H01L 21/76897 |
| 2016/0254191 A1 | 9/2016 | Tseng et al. | |
| 2019/0097023 A1 | 3/2019 | Wu | |
| 2019/0122934 A1 | 4/2019 | Chang et al. | |
| 2019/0123189 A1 | 4/2019 | Chen et al. | |
| 2019/0140080 A1 * | 5/2019 | Lee | ..................... H01L 29/0847 |

OTHER PUBLICATIONS

Extended European Search Report dated Feb. 5, 2020 in counterpart European Application No. 19186997.3 in 8 pages.

* cited by examiner

*Primary Examiner* — Cheung Lee
(74) *Attorney, Agent, or Firm* — Knobbe, Martens, Olson & Bear, LLP

(57) ABSTRACT

In one aspect, a method can include forming, by self-aligned multiple patterning, a first pattern of regularly spaced mandrels on a layer to be patterned; forming hard mask spacers on sidewalls of the mandrels, thereby forming a second pattern formed of assemblies comprising a mandrel and hard mask spacers on sidewalls thereof; and etching the second pattern in the layer to be patterned.

12 Claims, 9 Drawing Sheets

SELF-ALIGNED LAYER PATTERNING

CROSS-REFERENCE TO RELATED APPLICATIONS

This application claims foreign priority to European Patent Application No. EP 19186997.3, filed Jul. 18, 2019, the content of which is incorporated by reference herein in its entirety.

BACKGROUND

Field

The disclosed technology generally relates to the field of layer patterning.

Description of the Related Technology

To pattern parallel lines in a semiconductor material, a procedure can include covering the semiconductor with a hard mask, forming parallel lines of a photoresist material by lithography on the hard mask, and transferring these lines in the hard mask and ultimately in the semiconductor material.

SUMMARY OF CERTAIN INVENTIVE ASPECTS

The disclosed technology can relate to the patterning of parallel lines in a semiconductor material, such as in the formation of fin field effect transistor (FinFET) gates.

The process of patterning lines in a semiconductor material can form lines of 42 nm width separated by spaces of 42 nm width. Forming lines of smaller width with lithographic processes can be challenging. To increase the density of lines, one can use a line multiplication process such as self-aligned multiple patterning (SAMP). One SAMP process is self-aligned double patterning (SADP). In a SADP process, each line of the lithographically printed pattern can serve as a core or mandrel on which a hard mask spacer can be deposited. The hard mask spacer can be present on the sidewalls and on the top of the mandrels. The hard mask spacers can be etched back until the top of the mandrels are exposed. The mandrels can be removed by etching, leaving a pattern formed by the hard mask spacers. This pattern can be transferred in the underlying layer. This pattern can have a pitch which is twice smaller than the pitch of the lithographically printed pattern. The density of lines can thereby be doubled. In this example, the lines and the spaces between them can each be 21 nm wide. Although SAMP can form lines having the same width as the spaces between them, this feature may not always be desired. There is therefore a desire in the art for methods enabling the formation of lines wider than the space between them at a pitch which may not be accessible by direct lithography.

It is an object of the disclosed technology to provide methods of patterning a layer.

In one aspect, the disclosed technology relates to a method comprising:
  a. forming, e.g., by self-aligned multiple patterning, a first pattern of regularly spaced (e.g., substantially regularly spaced) mandrels (4) on a layer (3) to be patterned,
  b. forming hard mask spacers (5) on sidewalls of the mandrels (4), thereby forming a second pattern formed of assemblies (4,5) comprising a mandrel (4) and hard mask spacers (5) on sidewalls thereof, and
  c. etching the second pattern in the layer (3) to be patterned (e.g., transferring the second pattern into the layer by etching).

In some implementations, the disclosed technology provides a procedure enabling the formation of lines wider than the space between them at a pitch which may not be accessible by direct lithography. For example, this can translate into a pitch remaining at 42 nm but the lines can be wider than 21 nm (e.g., 28 nm) while the spaces between them can be narrower than 21 nm (e.g., 14 nm).

The formation of a FinFET can entail the formation of a semiconductor fin and of a gate covering sides of part of the fin. The part of the fin covered by the gate can act as the channel and the gate can be used to control the current flowing through that channel. The formation of the gate can be done by a replacement metal gate (RMG) process involving the formation of a dummy gate in the early stages of the process and its replacement by the actual gate stack at the end of the process. The dummy gate can be a sacrificial structure aimed at occupying the place that can ultimately be occupied by the actual gate stack. The dummy gate can be formed of polysilicon. As depicted in FIG. 12, the dummy gate (3) can be protected by a hard mask on top of the dummy gate, and gate spacers (6) covering the sides of the dummy gate and of the hard mask. The hard mask can protect the dummy gate from the top during etching used during the early stages of the RMG process, and the gate spacers can protect the dummy gate from the sides during the early stages while delimiting the lateral extent of the future actual gate. To form these dummy gates, SAMP line multiplication processes can be used to achieve a gate width smaller than what can be achieved by lithography alone.

At the end of the dummy gate patterning, the desired gate width may be smaller than the width achieved by the SAMP process used. For instance, the SAMP process may form 21 nm dummy gate lines with a 42 nm pitch while 16 nm dummy gate lines may be be desired for this same 42 nm pitch. Hence, a trimming of the dummy gate lines can be performed. Once this trimming is performed, as depicted in FIG. 12, the sidewalls of the trimmed dummy gate lines (3) and of the hard mask thereon can be coated with the gate spacer (6). For instance, 6 nm of gate spacer may be present on each side of each line. The width of the trimmed line-spacer assembly can be in this case be 28 nm.

In the early stages of the RMG process, the part of the fin not covered by the dummy gate, on either side of the gate, can be used to form the source and the drain of the FinFET. Source and drains can be formed by epitaxial growth of a semiconductor on parts of the fin not covered by the dummy gate.

Prior to this epitaxial growth, it can be advantageous to reduce the height of these uncovered parts of the fin. This can be true when the fins are very high as, for instance, in the case of the complementary field effect (CFET) technology. In CFET, the fins can be about 80 nm high. Epitaxially growing sources and drain on such high fin parts can be problematic in some instances. It can be advantageous to reduce the height of the uncovered fin parts, e.g., to a large extent, prior to epitaxially growing the source and drains therefrom. As a result, in the case of a 80 nm fin, a bit less than 80 nm of the uncovered fin parts can be recessed. It can be desirable that the dummy gate remains covered on all sides after the recessing of the uncovered fin parts. If it were not the case, in some instances, the subsequent step of epitaxially growing the source and the drain may lead to parasitic epitaxial growth on the exposed dummy gates. To achieve an adequate protection of the dummy gate, the hard mask height can be chosen to be high enough so that it is not entirely consumed before the uncovered fin parts are recessed. As depicted in FIG. 13, a challenge may be that the gate spacers (6) may be exposed to the etchant and may therefore be consumed during the recessing of the uncovered fin parts. This may lead to the sidewalls (7) of the dummy gate (3) becoming exposed during the recessing of the uncovered fin parts.

Various implementations of the disclosed technology can protect the top of the gate spacers with the hard mask, e.g., to have the hard mask lines wider than the dummy gate lines so that the hard mask lines can be wide enough to cover at least part of the gate spacers lining the dummy gate lines. To keep both the pitch (e.g., 42 nm) and the dummy gate lines width (e.g., 16 nm) unchanged, the hard mask lines can be wider than the space between them as described herein.

In various implementations, by skipping the mandrel removal in a SAMP process, lines thicker than the spaces between them can be obtained. For example, instead of removing the mandrels prior to the transfer of the hard mask pattern in the semiconductor material, the mandrels can be left in place and the whole assembly hard mask spacers-mandrel can be transferred instead. As a result, lines thicker than the spaces between them can be formed in the semiconductor material, the dimensions of which can be smaller than by lithography alone.

One advantage of some embodiments of the disclosed technology is that dummy gate lines of more uniform thickness can be obtained than in the prior art. Also less unwanted etching of the dummy gates can occur. In some embodiments, about 50% less of the dummy gate is etched away, compared to the prior art.

Without being bound by theory, it is believed that this more uniform thickness of the dummy gate lines may be due to the smaller space between the hard mask lines.

Another advantage of some embodiments of the disclosed technology is that it can permit the formation of taller gates than in the prior art. Irregular profile of the dummy gate lines can limit the dummy gate height that can be achieved. This is much less the case in some embodiments of the disclosed technology. Also, the risk of dummy gate line collapse can be reduced when compared to the prior art.

Another advantage of some embodiments is being able to adapt to existing SAMP procedures in the field of semiconductor processing.

In another aspect, the disclosed technology relates to an intermediate structure in the formation of a Fin-based Field Effect Transistor, comprising:
  A semiconductor fin,
  A dummy gate,
  An assembly comprising a mandrel having hard mask spacers on sidewalls thereof, the assembly covering the top of the dummy gate,
  wherein the width of the assembly can be within 5% of the width of the dummy gate.

The intermediate structure of various embodiments described herein can be obtained by the method according to various embodiments described herein and can serve a signature that a certain method described herein has been used.

The above objectives can be accomplished by a method and device according to the disclosed technology.

Particular and example aspects of the disclosed technology are set out herein, e.g., in the accompanying independent and dependent claims. Features from the dependent claims may be combined with features of the independent claims and with features of other dependent claims as appropriate and not merely as explicitly set out in the claims.

Although there may be constant improvement, change and evolution of devices in this field, the disclosed technology represents substantial new and novel improvements, including departures from prior practices, resulting in the provision of more efficient, stable and reliable devices of this nature.

The above and other characteristics, features and advantages of the disclosed technology can become apparent from the following detailed description, taken in conjunction with the accompanying drawings, which illustrate, by way of example, the principles of the disclosed technology. This description is given for the sake of example only, without limiting the scope of the disclosed technology. The reference figures quoted below refer to the attached drawings.

Figure 1:
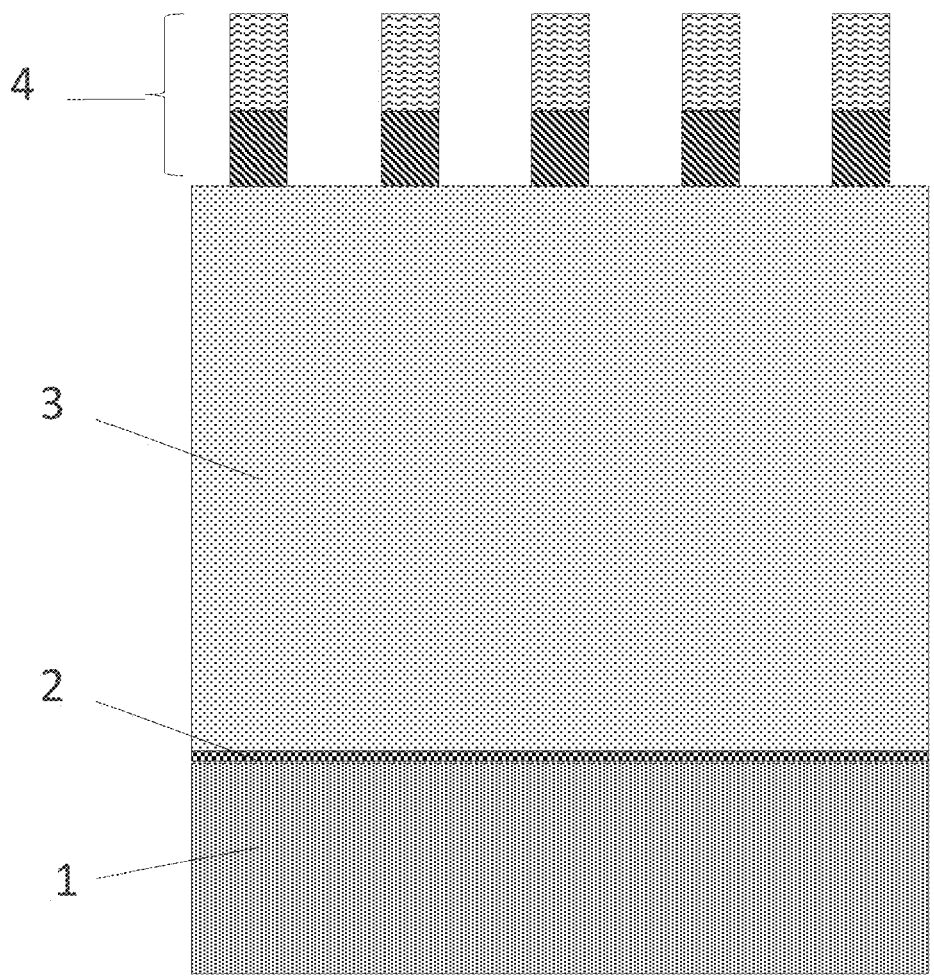
FIGS. 1, 3, 5, 6, 9, 10, and 11 are schematic representations of vertical cross-sections through intermediate structures obtained after various stages of an embodiment of the disclosed technology.

In the different figures, the same reference signs may refer to the same or analogous elements.

DETAILED DESCRIPTION OF CERTAIN ILLUSTRATIVE EMBODIMENTS

The disclosed technology will be described with respect to particular embodiments and with reference to certain drawings but the disclosed technology is not limited thereto. The drawings described are only schematic and are non-limiting. In the drawings, the size of some of the elements may be exaggerated and not drawn on scale for illustrative purposes. The dimensions and the relative dimensions do not correspond to actual reductions to practice of the disclosed technology.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosed technology described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosed technology described herein are capable of operation in other orientations than described or illustrated herein.

It is to be noticed that the term "comprising", used herein, e.g., in the claims, should not be interpreted as being restricted to the features listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising A and B" should not be interpreted as being limited to devices consisting only of components A and B.

In reference throughout this specification to "one embodiment" or "an embodiment," a particular feature, structure or characteristic described in connection with the embodiment is included in at least one embodiment of the present disclosed technology. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments of the disclosed technology, various features of the disclosed technology are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed technology requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosed technology.

Furthermore, while some embodiments described herein include some but not other features included in other embodiments, combinations of features of different embodiments are meant to be within the scope of the disclosed technology, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other apparatus to carry out the function. Thus, a processor with the instructions to carry out such a method or element of a method forms an apparatus to carry out the method or element of a method. Furthermore, an element described herein of an apparatus embodiment is an example to carry out the function performed by the element in the purpose of carrying out the disclosed technology.

In the description provided herein, numerous specific details are set forth. However, it is understood that embodiments of the disclosed technology may be practiced without these specific details. In other instances, well-known methods, structures and techniques have not been shown in detail in order not to obscure an understanding of this description.

Reference will be made to transistors. These can include three-terminal devices having a first main electrode such as a drain, a second main electrode such as a source, and a control electrode such as a gate to control the flow of electrical charges between the first and second main electrodes.

Figure 5:
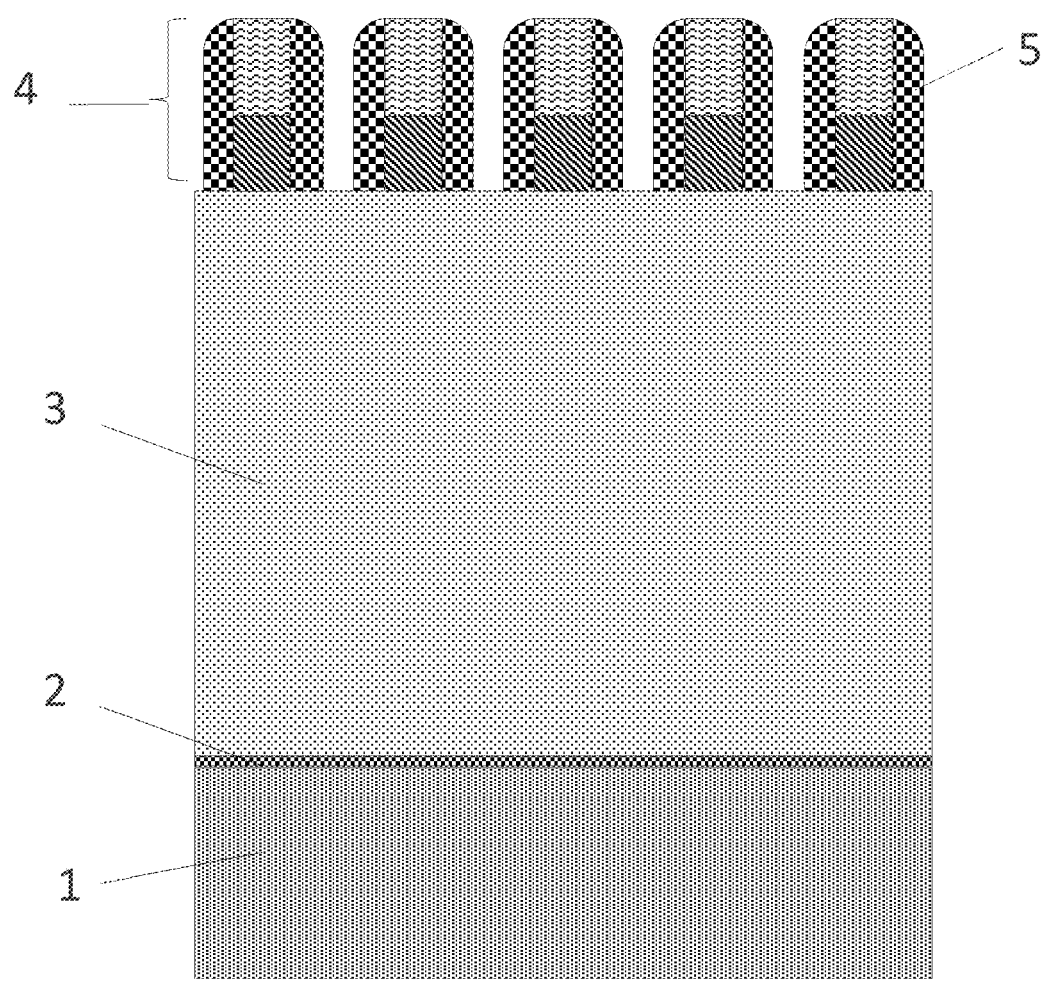
Figure 6:
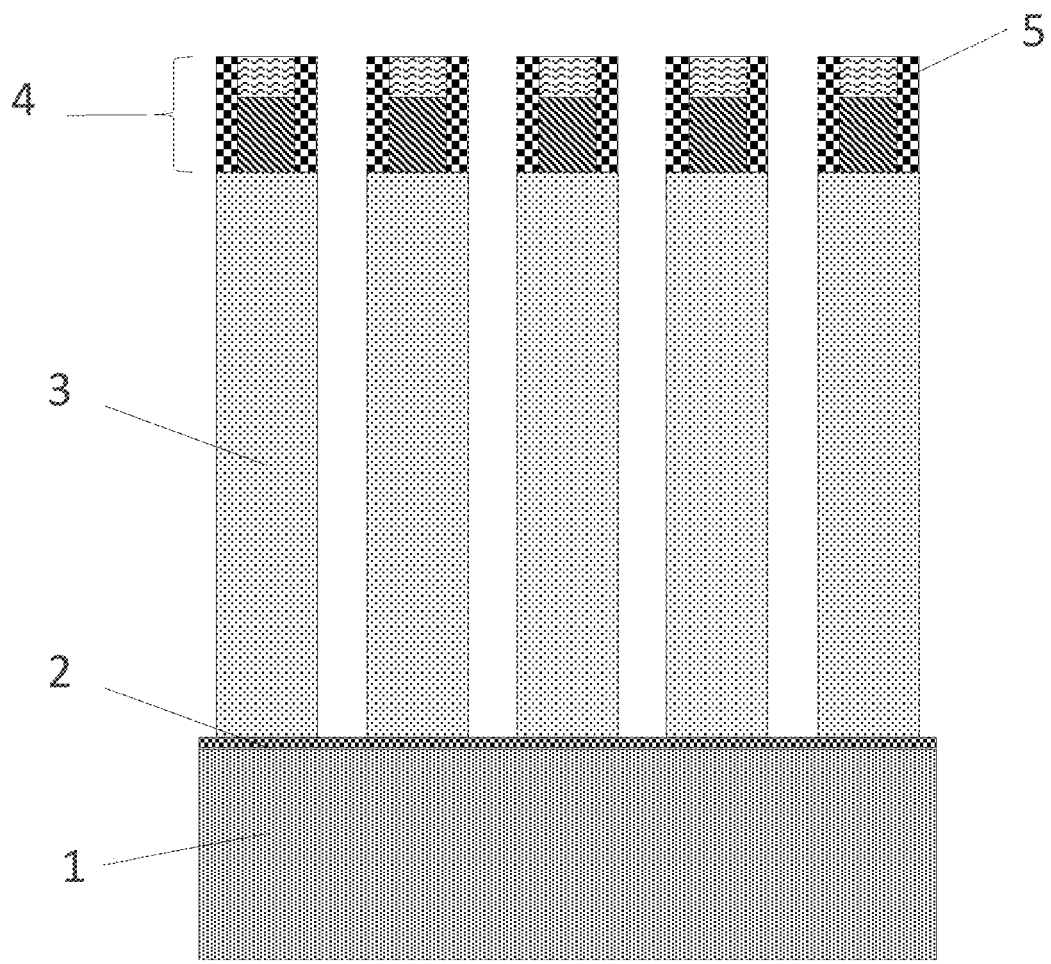
Figure 7:
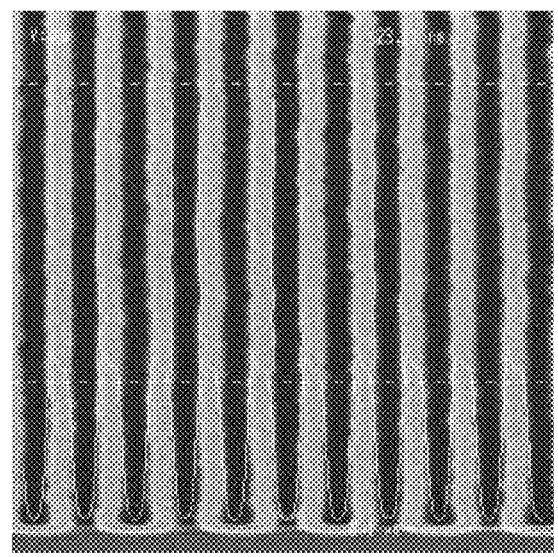
Figure 8:
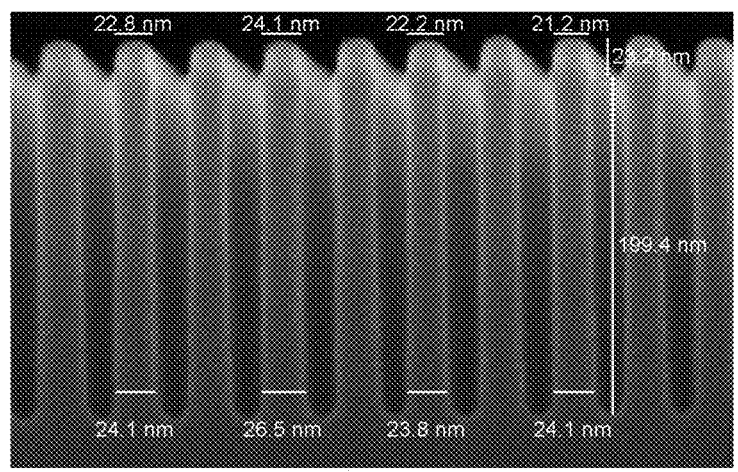
FIG. 8 is an image obtained by cross-sectional scanning electron microscopy of a vertical cross-sectional view of an intermediate structure obtained experimentally and corresponding to the stage illustrated in FIG. 6.

One aspect of the disclosed technology relates to a method comprising:

a. forming, e.g., by self-aligned multiple patterning, a first pattern of regularly spaced (e.g., substantially regularly spaced) mandrels (4) on a layer (3) to be patterned (see FIGS. 1 and 2), b. forming hard mask spacers (5) on sidewalls of the mandrels, thereby forming a second pattern formed of assemblies comprising a mandrel and hard mask spacers on sidewalls thereof (see, e.g., FIGS. 3 to 5), and c. etching to pattern the layer using the second pattern as an etch mask (see e.g., FIGS. 6 to 8).

In step a, SAMP can be used to form a first pattern of regularly spaced (e.g., substantially regularly spaced) mandrels on the layer to be patterned.

SAMP (not depicted) can comprise forming a pattern of regularly spaced first elements on a layer to be patterned, forming hard mask spacers on sidewalls of these first elements, removing the first elements, thereby leaving a pattern of spacers, and transferring the pattern of spacers in the layer to be patterned, thereby forming a pattern of regularly spaced second elements (corresponding to the mandrels formed in step a). In SADP, the first elements can be formed directly by lithography, e.g., by transferring a photoresist pattern in a hardmask. In self-aligned quadruple patterning (SAQP), the first elements can be the second elements formed by SADP.

In general, SADP can be considered as an SAMP of order 1, SAQP can be considered as an SAMP of order 2, etc . . . , for an SAMP of order n+1, the first elements can be the second elements formed by an SAMP of order n.

The shape of each element in some instances can be the same (e.g., substantially the same). As used herein, reference to "each" of a particular element (e.g., "each element") may refer to two or more of the elements, and may or may not refer to every one of the elements in the pattern. For example, "each element" may refer to individual ones of a plurality of elements and not necessarily every single element in the pattern.

In some embodiments, the shape of each mandrel in some instances can be the same (e.g., substantially the same).

The elements in some instances can be lines. As a result, in some embodiments, the mandrels can be lines.

The first pattern in some instances can be formed of parallel (e.g., substantially parallel) lines.

In some embodiments, each mandrel forming the pattern may have a width of at most 40 nm. For instance, they may have a width of from 1 to 40 nm.

In various implementations, they may have a width of from 1 to 30 nm. In some implementations, they may have a width from 1 to 25 nm. In some instances, they may have a width from 12 to 25 nm.

The widths of the mandrels in various implementations can be within 10%, e.g., within 5% of one another. In some instances, the widths can be the same (e.g., substantially the same).

In some embodiments, the height of the mandrels may be from 1.5 to 10 times, e.g., from 3 to 6 times, or from 4 to 5 times the width of the mandrels.

The heights of the mandrels in some implementations can be within 10%, e.g., within 5% of one another. In some instances, the heights can be the same (e.g., substantially the same).

The mandrels can be separated by spaces. The widths of the spaces in some implementations can be within 10%, e.g., within 5% of one another. In some instances, the widths can be the same (e.g., substantially the same).

The average width of the spaces in some implementations can be within 10%, e.g., within 5% of the average width of the mandrels. In some instances, the average width of the spaces can be the same (e.g., substantially the same) as the average width of the mandrels.

In some embodiments, the widths of the mandrels may be within 10% of one another, the widths of the spaces between the mandrels can be within 10% of one another and the average mandrel width can be within 10% of the average space width.

In some embodiments, the mandrels may comprise a bottom layer made of a first material and a top layer made of a second material.

In some embodiments, the bottom layer may be made of silicon nitride or silicon carbide and the top layer may be made of silicon oxide.

In some embodiments, the height of the bottom layer may be from 0.7 to 4.5, e.g., 1.5 to 2.5 times the width of the mandrels.

In some embodiments, the height of the top layer may be from 0.8 to 5.5, e.g., 2 to 3 times the width of the mandrels.

In some embodiments, the layer to be patterned in step a may be a layer of semiconductor material. For instance, it may be polycrystalline silicon or amorphous silicon.

The material of the layer to be patterned can be selected in such a way that it can be etched selectively with respect to the material(s) forming the mandrels and the spacers.

In some embodiments, the thickness of the layer to be patterned may be from 5 times to 15 times, e.g., from 7 times to 13 times the width of the mandrels.

In some embodiments, the thickness of the layer to be patterned may be from 100 to 350 nm, e.g., from 150 to 300 nm.

In step b, forming hard mask spacers on sidewalls of the mandrels may comprise a step b1 of forming a conformal layer of spacer material over the mandrels, thereby lining the top and the sidewalls of the mandrels, and a step b2 of etching part of the spacer material so as to expose the top of the mandrels while keeping the sidewalls of the mandrels covered.

The material of the hard mask spacers may for instance be an oxide, a nitride, a carbide, a carbonitride, an oxycarbonitride, an oxynitride, or an oxycarbide of silicon. It can be an oxide of silicon since polycrystalline silicon used for the layer to be patterned shows a higher etching selectivity with respect to oxides of silicon than with respect to the nitrides or carbides.

The result of step b can be the formation of a second pattern formed of assemblies comprising a mandrel and hard mask spacers.

The assemblies can be wider than the space between them.

In some embodiments, the assemblies may be separated by spaces and the assemblies may have an average width at least 50% larger than the width of the spaces between them.

In step c, the second pattern can be etched in the layer to be patterned.

The methods of the disclosed technology can find various applications. For example, they can be useful in forming a pattern of dummy gates during the manufacture of a semiconductor device, e.g., the layer to be patterned is a layer of dummy gate material. In this case, step c can result in the formation of a pattern of dummy gate etched in the layer of dummy gate material.

In such a case, the intermediate structure resulting from step c may comprise:
  A semiconductor fin,
  A dummy gate,
  An assembly comprising a mandrel having hard mask spacers on sidewalls thereof, the assembly covering the top of the dummy gate,
  wherein the width of the assembly can be within 5% of the width of the dummy gate. In some implementations, the width of the assembly can be within 2% of the width of the dummy gate. In some instances, these widths can be the same (e.g., substantially the same).

When the method aims at forming a pattern of dummy gates, the method may further comprise a step d, e.g., after step c, of reducing the width of the dummy gates. The width of the dummy gate may for instance be reduced by 25 to 40%, for instance by 30 to 35%. After the trimming, the assemblies can be wider than the dummy gate lines. The method may further comprise a step e, e.g., after step d, of forming gate spacers on sidewalls of the dummy gates.

In some embodiments, the assemblies can be wide enough to cover at least part of the gate spacers lining the dummy gate lines.

In some embodiments, step e may comprise a step e1 of forming a gate spacer on the sidewalls of the dummy gates and on the sidewalls of the hard mask spacers, and a step e2 of etching selectively the gate spacer present on the sidewalls of the hard mask spacers with respect to the gate spacers present on the sidewalls of the dummy gates. Step e1 may for instance be performed by atomic layer deposition (ALD). Step e2 can operate while the gate spacer present on the sidewalls of the dummy gate is protected by the assembly.

In some embodiments, the material of the gate spacers may be different from the material of the hard mask spacers. Examples of suitable materials for the gate spacer are silicon nitride and silicon oxycarbide, amongst others.

In some embodiments, the layer of dummy gate material may be over a semiconductor fin, and the method may further comprise:
  a step f, e.g., after step e, of etching a part of the semiconductor fin which is not covered by the dummy gates, thereby reducing the height of the semiconductor fin, and
  a step g, e.g., after step f, of epitaxially growing a source or a drain on the etched part of the semiconductor fin.

In some embodiments, the height of the semiconductor fin may be at least 70 nm.

Any feature of the methods described herein may be as correspondingly described in any intermediate structure described herein.

In another aspect, the disclosed technology relates to an intermediate structure in the formation of a fin-based field effect transistor, comprising:
  A semiconductor fin,
  A dummy gate,
  An assembly comprising a mandrel having hard mask spacers on sidewalls thereof, the assembly covering the top of the dummy gate,
  wherein the width of the assembly can be within 5% of the width of the dummy gate.

In some embodiments, the dummy gate can have a first width measured at 10% of its height, and a second width measured at 90% of its height, and the first width and the second width can be within 10% of one another.

Any feature of the intermediate structures described herein may be as correspondingly described in any method described herein.

Additional detailed descriptions of several embodiments of the disclosed technology will be described. It is clear that other embodiments of the disclosed technology can be configured according to the knowledge of persons skilled in the art without departing from the technical teaching of the disclosed technology.

Figure 2:
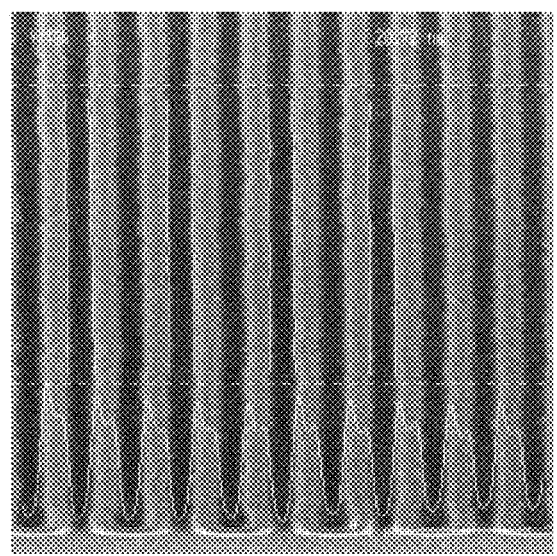
FIGS. 2, 4 and 7 are images obtained by top down critical dimension scanning electron microscopy of intermediate structures obtained experimentally and corresponding to the stages illustrated in FIGS. 1, 3, and 6 respectively.

FIGS. 1 and 2 will be further described.

FIG. 1 shows a simplified schematic vertical cross-section of a semiconductor structure. Present but not depicted in this cross-section is a silicon substrate comprising a plurality of 80 nm high, 6 nm wide fins at a 25 nm pitch. Depicted are a shallow trench isolation (1) made of a silicon oxide, a 2 nm silicon oxide (2) deposited by plasma-enhanced atomic layer deposition (PEALD) on the shallow trench isolation, a layer (3) to be patterned on the PEALD silicon oxide, and a first pattern, formed by SADP, of regularly spaced (e.g., substantially regularly spaced) mandrels (4) on the layer (3). This layer (3) is in this instance made of polycrystalline silicon and is 200 nm thick. The mandrels are made of a bottom 40 nm $Si_3N_4$ layer and a top 50 nm $SiO_2$ layer. The mandrels are spaced at a pitch of 42 nm and have a width of 21 nm. FIG. 2 is a top view obtained by top down critical dimension scanning electron microscopy of this structure.

Figure 3:
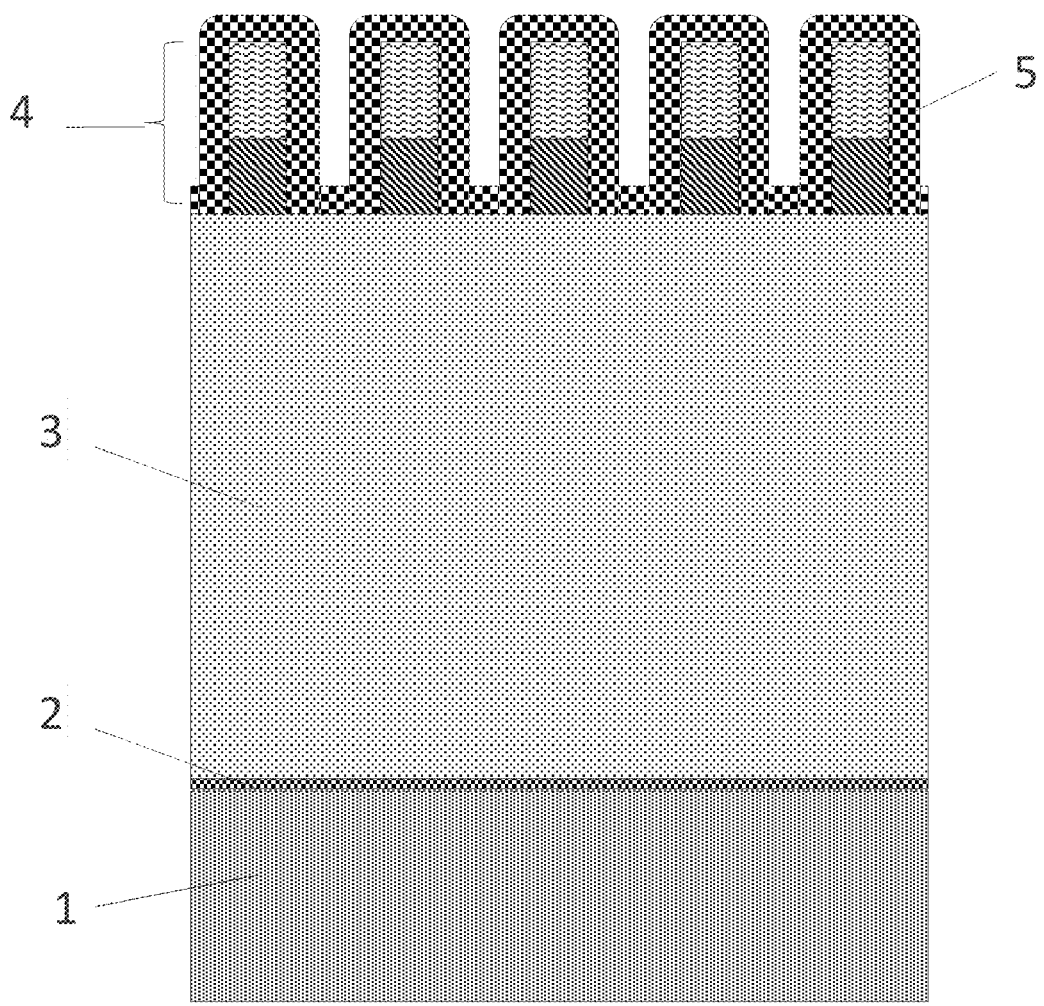
Figure 4:
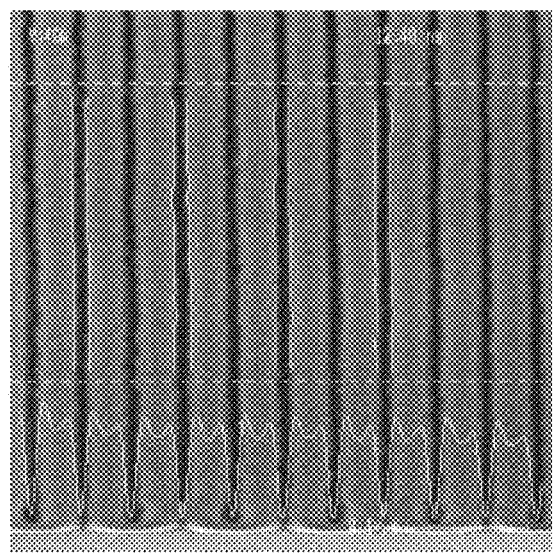

In FIG. 3, a layer (5) of $SiO_2$ has been applied on the mandrels and is present on the top and the sidewalls of the mandrels. FIG. 4 shows a top view obtained by top down critical dimension scanning electron microscopy of this structure.

In FIG. 5, the $SiO_2$ layer (5) has been etched until the top of the mandrels was exposed. The assembly composed of the mandrel and the hard mask in this example is wider than the space between them.

In FIG. 6, the assembly composed of the mandrel and the hard mask spacers have been used as a mask to etch the layer to be patterned, thereby forming dummy gates which are wider than the spaces between them. The pitch remains the same as in FIGS. 1 and 2. FIG. 7 shows a top view obtained by top down critical dimension scanning electron microscopy of this structure. FIG. 8 shows a vertical cross-section micrograph of this structure obtained by cross-sectional scanning electron microscopy.

Figure 9:
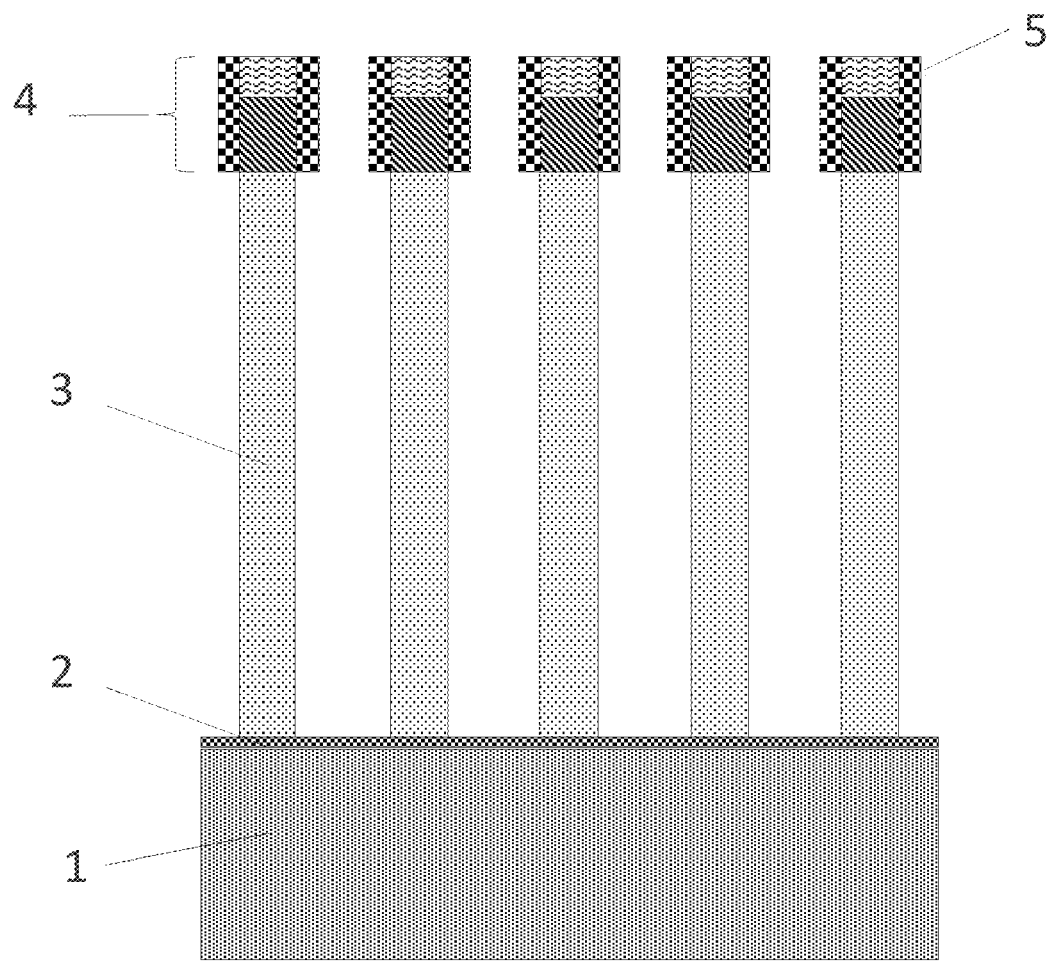

In FIG. 9, the dummy gates have been trimmed to reduce their width from more than 24 nm to about 16 nm.

Figure 10:
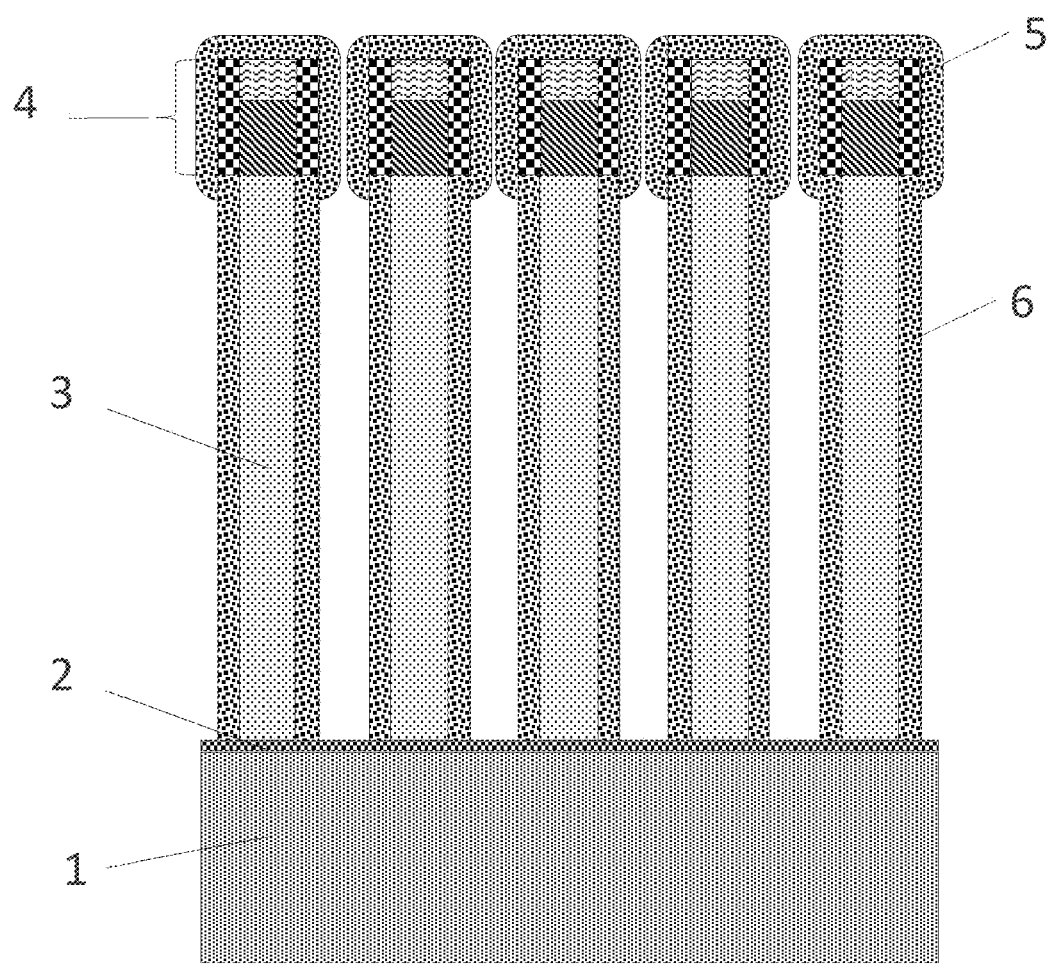
Figure 11:
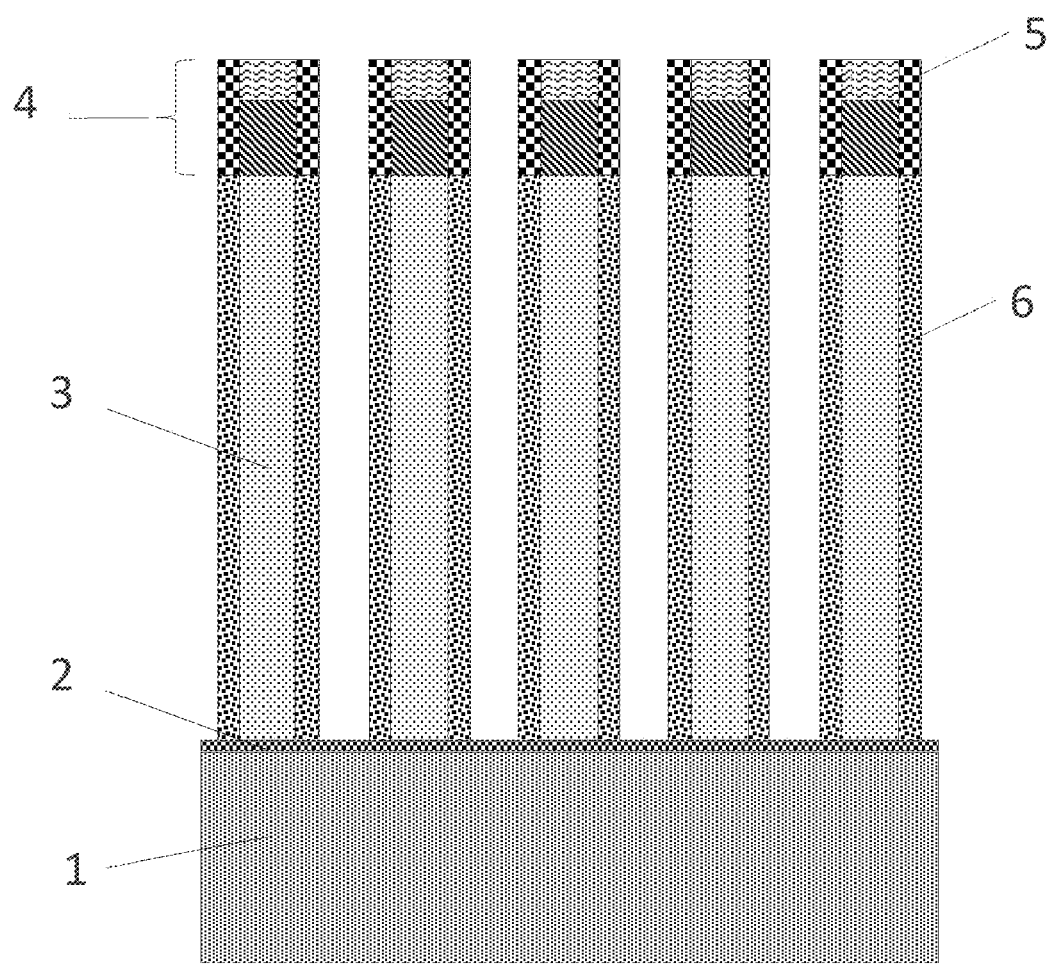
Figure 12:
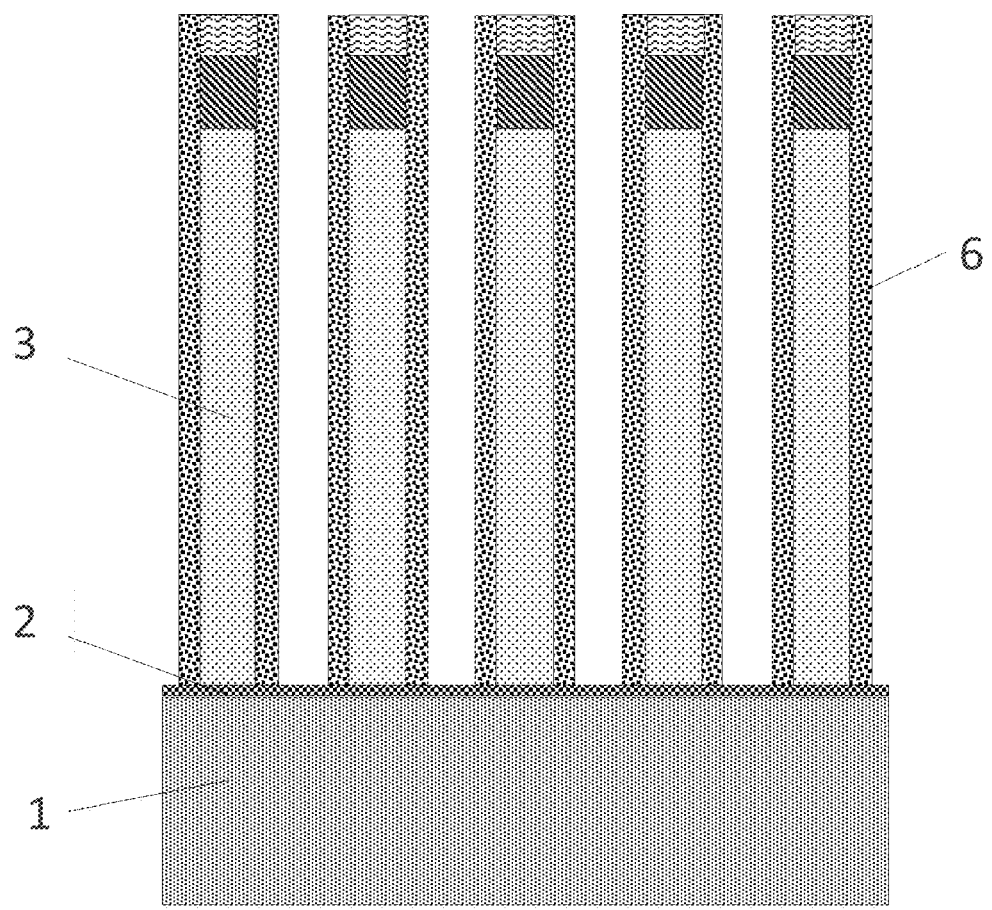
FIGS. 12 and 13 are schematic representations of vertical cross-sections through intermediate structures obtained after various stages of an example process.
Figure 13:
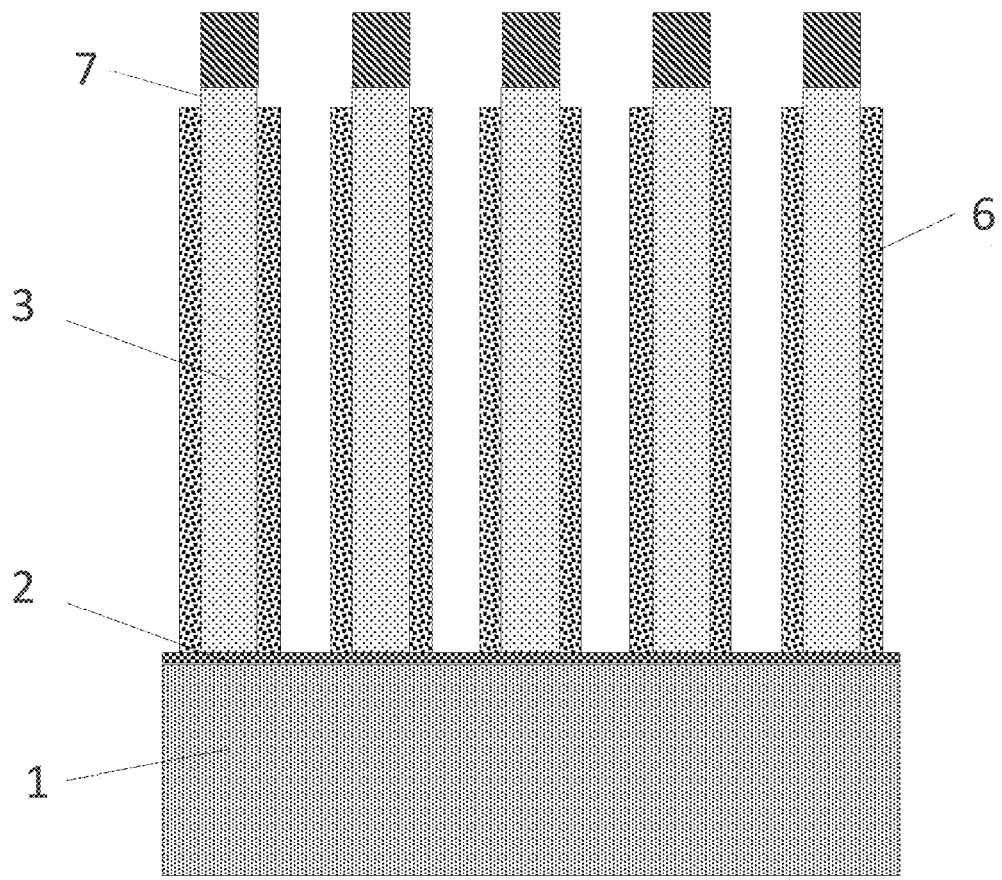

In FIG. 10, a silicon nitride gate spacer (6) has been deposited conformally by ALD on the dummy gates and the assemblies. Next, in FIG. 11, the gate spacer present on the sidewalls of the hard mask spacers was etched selectively with respect to the gate spacers present on the sidewalls of the dummy gates. This etching operates while the gate spacer present on the sidewalls of the dummy gate is protected by the hard mask spacers.

It is to be understood that although certain embodiments, specific constructions and configurations, as well as materials, have been discussed herein for devices according to the present invention, various changes or modifications in form and detail may be made without departing from the scope of this invention. Steps may be added or deleted to methods described within the scope of the present invention.

What is claimed is:

1. A method comprising:
   forming, by self-aligned multiple patterning, a first pattern of regularly spaced mandrels on a layer to be patterned;
   forming hard mask spacers on sidewalls of the mandrels, thereby forming a second pattern formed of assemblies comprising a mandrel and hard mask spacers on sidewalls thereof; and
   etching to pattern the layer using the second pattern as an etch mask,
   wherein the method is adapted to form a pattern of dummy gates during fabrication of a semiconductor device, and wherein the patterned layer is a layer of dummy gate material.

2. The method according to claim 1, further comprising reducing widths of the dummy gates.

3. The method according to claim 2, further comprising forming gate spacers on sidewalls of the dummy gates.

4. The method according to claim 3, wherein forming the gate spacers on the sidewalls of the dummy gates comprises forming the gate spacers on sidewalls of the hard mask spacers and etching selectively the gate spacers present on the sidewalls of the hard mask spacers with respect to the gate spacers present on the sidewalls of the dummy gates.

5. The method according to claim 3, wherein the layer of dummy gate material is over a semiconductor fin, and wherein the method further comprises:
   etching a part of the semiconductor fin which is not covered by the dummy gates, thereby reducing a height of the semiconductor fin; and
   epitaxially growing a source or a drain on the etched part of the semiconductor fin.

6. The method according to claim 5, wherein the semiconductor fin is at least 70 nm high.

7. The method according to claim 3, wherein the gate spacers are formed of a material that is different from a material of the hard mask spacers.

8. The method according to claim 1, wherein each mandrel forming the pattern has a width of at most 40 nm.

9. The method according to claim 1, wherein widths of the mandrels are within 10% of one another, wherein widths of spaces between the mandrels are within 10% of one another, and wherein an average mandrel width is within 10% of an average space width.

10. The method according to claim 1, wherein the patterned layer is a layer of semiconductor material.

11. The method according to claim 1, wherein the mandrels comprise a bottom layer and a top layer, wherein the bottom layer is made of silicon nitride or silicon carbide, and wherein the top layer is made of silicon oxide.

12. The method according to claim 1, wherein the assemblies are separated by spaces, and wherein the assemblies have an average width at least 50% larger than a width of the spaces between them.

* * * * *